United States Patent [19]
Park

[11] Patent Number: 6,108,252
[45] Date of Patent: Aug. 22, 2000

[54] INTEGRATED CIRCUIT MEMORY DEVICES HAVING SELF-TEST CIRCUITS THEREIN AND METHOD OF TESTING SAME

[75] Inventor: Sang-bong Park, Kyungki-do, Rep. of Korea

[73] Assignee: Samsung Electronics Co., Ltd., Rep. of Korea

[21] Appl. No.: 09/245,475

[22] Filed: Feb. 5, 1999

[30] Foreign Application Priority Data

Feb. 6, 1998 [KR] Rep. of Korea .......................... 98-3509

[51] Int. Cl.⁷ ...................................................... G11C 7/00
[52] U.S. Cl. ..................... 365/201; 365/189.07; 371/21.2
[58] Field of Search ............................... 365/201, 230.03, 365/189.07; 371/21.2

[56] References Cited

U.S. PATENT DOCUMENTS

| | | | |
|---|---|---|---|
| 5,138,619 | 8/1992 | Fasang et al. | 371/21.1 |
| 5,254,883 | 10/1993 | Horowitz et al. | 307/443 |
| 5,383,195 | 1/1995 | Spence et al. | 371/22.5 |
| 5,388,104 | 2/1995 | Shirotori et al. | 371/21.1 |
| 5,416,784 | 5/1995 | Johnson | 371/22.5 |
| 5,533,032 | 7/1996 | Johnson | 371/22.5 |
| 5,535,164 | 7/1996 | Adams et al. | 365/201 |
| 5,568,437 | 10/1996 | Jamal | 365/201 |
| 5,661,729 | 8/1997 | Miyazaki et al. | 371/21.2 |
| 5,668,815 | 9/1997 | Gittinger et al. | 371/21.2 |
| 5,675,545 | 10/1997 | Madhavan et al. | 365/201 |
| 5,734,613 | 3/1998 | Gibson | 365/189.04 |
| 5,742,557 | 4/1998 | Gibbins et al. | 365/230.05 |
| 5,764,655 | 6/1998 | Kirihata et al. | 371/22.5 |
| 5,784,323 | 7/1998 | Adams et al. | 365/201 |
| 5,818,772 | 10/1998 | Kuge | 365/201 |

Primary Examiner—Richard Elms
Assistant Examiner—Tuan T. Nguyen
Attorney, Agent, or Firm—Myers Bigel Sibley & Sajovec

[57] ABSTRACT

Integrated circuit memory devices having self test circuits therein may be tested by performing an interleave test on a plurality of memory banks in the memory device, to determine a first test failure and then performing a bank-by-bank test on the plurality of memory banks with all of a plurality of AC parameters set to respective minimum margin conditions, to determine a second test failure. These AC parameters may include a first bank active to first bank active time interval (tRC), a first bank active to first bank read time interval (tRCD), a first bank active to first bank precharge time interval (tRAS), a first bank precharge to first bank active time interval (tRP) and a column address to column address delay time interval (tCCD). A bank-by-bank test is then performed on the plurality of memory banks with all of the plurality of AC parameters set to respective maximum margin conditions, to determine a third test failure. Finally, a bank-by-bank test is performed on the plurality of memory banks with only one of the plurality of AC parameters set to a respective minimum margin condition. This latter step is repeated for each AC parameter and need not be performed unless the first and second test failures occur and the third test failure does not occur.

12 Claims, 5 Drawing Sheets

6,108,252

INTEGRATED CIRCUIT MEMORY DEVICES HAVING SELF-TEST CIRCUITS THEREIN AND METHOD OF TESTING SAME

RELATED APPLICATION

This application is related to Korean Application No. 98-3509, filed Feb. 6, 1998, the disclosure of which is hereby incorporated herein by reference.

FIELD OF THE INVENTION

The present invention relates to integrated circuit devices, and more particularly to integrated circuit memory devices and methods of testing integrated circuit memory devices.

BACKGROUND OF THE INVENTION

In general, systems used for information processing and communication include memory devices and logic devices for control, operation and interface functions. In conventional systems, the logic devices and the memory devices are typically on separate semiconductor chips. However, as the need for low cost systems increases, together with developments in semiconductor design and manufacturing technology, research has been conducted into a single semiconductor chip containing both logic devices and memory devices.

Technologies for integrating a logic semiconductor device and a small capacity SRAM onto a single chip are conventional, and such technologies may include application specific integrated circuit (ASIC) technologies. However, recently much research has been conducted into the technology of integrating a DRAM, particularly a common SDRAM having a large capacity, with logic devices on a single chip. Such technology has been referred to as merged-memory logic (MML) technology.

Although semiconductor devices have advanced using MML, it is impossible to connect every internal pad (for voltages or signals related to embedded memory) with an external pin, because of limitation in the number of external pins. Thus, the functional operation and AC parameters of an embedded memory have been tested using a direct access method. According to the direct access method, a tester can directly access the memory in a test mode. Here, the tester generates an address, test input and control signals according to a memory test algorithm and compare the test input with the data output. According to this method, a multiplexer is inserted into an input port of the memory and the input selected in a test mode is connected to IO pins, to thereby minimize design revisions. However, the direct access method has the disadvantage that the number of required test pins may be too large. Also, the additional delay from the output of the memory to the I/O pin may make test results unreliable. Thus, it may be difficult to accurately obtain AC parameters for the memory. Also, it may be difficult to test parameters at the real clock rate of 100 MHz because of memory tester limitations.

The functions and AC parameters of an embedded memory can also be tested using a built-in self test (BIST) method. In the BIST method, a BIST circuit is installed in an MML. The merit of this method is that the functions of the memory are measured at the real clock rate by using a logic tester. However, the BIST method shows the result of whether or not the memory has failure as only one bit. Thus, it may be difficult to detect the row and column addresses of the failed cells, so the application of a redundancy circuit is also complicated. Also, because a fail test is performed on all cells by using a read/write/read pattern composed of a single test parameter, it may be difficult to analyze which parameters have no margin.

SUMMARY OF THE INVENTION

It is therefore an object of the present invention to provide improved integrated circuit memory devices and methods of testing same.

It is another object of the present invention to provide integrated circuit memory devices having built-in self test circuits and methods of testing same.

It is still a further object of the present invention to provide integrated circuit memory devices having built-in self test circuits which can identify addresses of defective memory cells and methods of testing same.

These and other objects, advantages and features of the present invention are provided by integrated circuit memory devices which contain preferred built-in self test (BIST) circuits and methods of testing same. In particular, according to a first embodiment of the present invention, a preferred method of testing a multi-bank integrated circuit memory device comprises the steps of performing an interleave test on a plurality of memory banks in the memory device, to determine a first test failure and then performing a bank-by-bank test on the plurality of memory banks with all of a plurality of AC parameters set to respective minimum margin conditions, to determine a second test failure. These AC parameters may include a first bank active to first bank active time interval (tRC), a first bank active to first bank read time interval (tRCD), a first bank active to first bank precharge time interval (tRAS), a first bank precharge to first bank active time interval (tRP) and a column address to column address delay time interval (tCCD).

Next, a bank-by-bank test is performed on the plurality of memory banks with all of the plurality of AC parameters set to respective maximum margin conditions, to determine a third test failure. Finally, a bank-by-bank test is performed on the plurality of memory banks with only one of the plurality of AC parameters set to a respective minimum margin condition. This latter step is repeated for each AC parameter and need not be performed unless the first and second test failures occur and the third test failure does not occur. Moreover, if a failure is not detected in response to the interleave test, the memory will pass the built-in test, however, if a failure is detected in response to the interleave test but no failure is detected upon performance of the bank-by-bank test with all AC parameters set to minimum margin conditions, then the memory will be determined to have defective interleave operation. Finally, if a failure is detected in response to the interleave test, a failure is detected upon performance of the bank-by-bank test with all AC parameters set to minimum margin conditions and a failure is also detected upon performance of the bank-by-bank test with all AC parameters set to maximum margin conditions, then the memory will be determined to be incapable of operating at is designated operation rate.

According to another embodiment of the present invention, a preferred built-in self test circuit may comprise a built-in self test (BIST) portion for generating a predetermined BIST information signal in response to an external clock signal and a BIST mode indication signal, and a switch multiplexer for outputting a signal to the memory by receiving a logic clock signal and a logic information signal output from the logic circuit, in a normal mode, and outputting a signal to the memory by receiving the external clock signal and the BIST information signal. According to this embodiment, the BIST portion detects the failed address by comparing data written to the memory with data output from the memory.

In particular, the BIST portion may comprise a BIST information signal generator for outputting input data and a control signal to the memory via the switch multiplexer in response to the external clock signal and the BIST mode indication signal, in the BIST mode, and for storing the input data. An address generator may also be provided in the BIST portion. The address generator may output an address of memory to be tested to the switch multiplexer while communicating with the BIST information signal generator. A comparator may also be provided to compare the input data generated by the BIST information signal generator, with output data read from the memory, to generate a fail indication signal indicating whether or not the memory has a failure.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
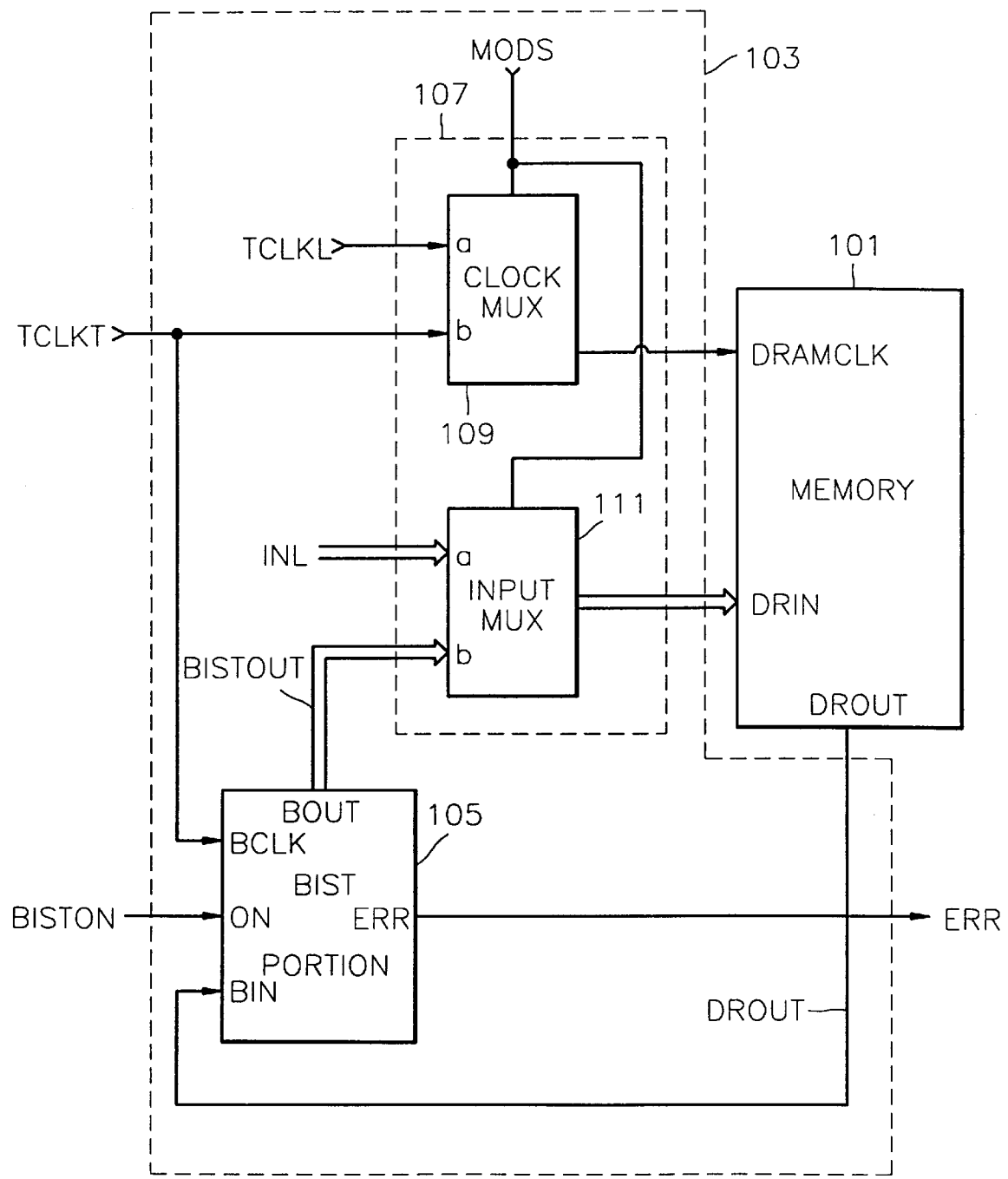
FIG. 1 is a block diagram of an integrated circuit memory device having a built-in self test circuit according to an embodiment of the present invention.

FIG. 1 shows a memory 101 including two banks and a built-in self test (BIST) circuit 103 according to a preferred embodiment of the present invention. The BIST circuit 103 includes a BIST portion 105 and a switch multiplexer (MUX) portion 107. The BIST portion 105 responds to an external clock signal TCLKT and a BIST mode indication signal BISTON during a BIST mode of operation. Also, the BIST portion 105 generates a BIST information signal BISTOUT in the BIST mode, which includes a row address RADD, a column address CADD, row address strobe signals RASB0 and RASB1 for the first and second banks, column address strobe signals CASB0 and CASB1 for the first and second banks, write enable signals WEB0 and WEB1 for the first and second banks, and input data DRIN. The BIST portion 105 compares data DRIN to be written to the memory 101 with data DROUT output from the memory 101, and detects the addresses of the failed memory and an AC parameter causing the failure.

The switch MUX portion 107 will now be described in detail. The switch MUX portion 107 includes a clock MUX 109 and an input MUX 111. The clock MUX 109 receives a logic clock signal TCLKL generated by a logic circuit (not shown) and the external clock signal TCLKT input from the outside during a BIST mode. Also, the clock MUX 109 provides the memory 101 with the logic clock signal TCLKL during a normal operating mode and the external clock signal TCLKT during the BIST mode. The input MUX 111 receives a logic information signal INL generated by a logic circuit (not shown) and the BIST information signal BISTOUT, and provides the memory 101 with the logic clock signal INL in the normal mode and the BIST information signal BISTOUT in the BIST mode.

Figure 2:
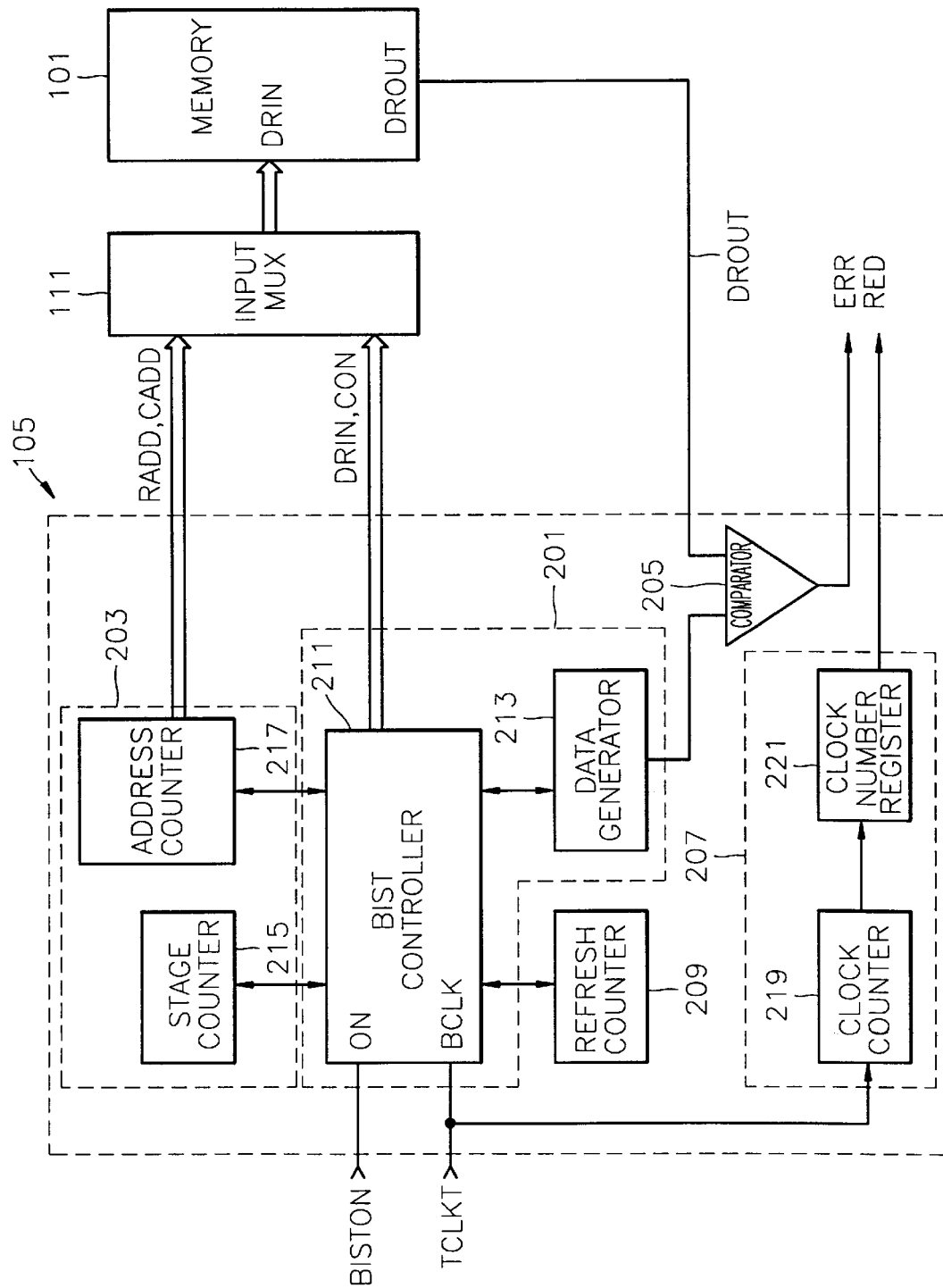
FIG. 2 is a block diagram of a preferred built-in self test circuit according to the device of FIG. 1.

FIG. 2 is a circuit diagram showing an example of the BIST portion 105 of FIG. 1. Referring to FIG. 2, the BIST portion 105 includes a BIST information signal generating portion 201, an address generating portion 203, a comparator 205, a fail address indicating portion 207 and a refresh counter 209. In detail, the BIST information signal generating portion 201 includes a BIST controller 211 and a data generator 213. During a BIST mode, the BIST controller 211 outputs input data DRIN and a control signal CON to the memory 101 via the input MUX 111 in response to the external clock signal TCLKT and the BIST mode direct signal BISTON. The data generator 213 outputs the same data as the input data DRIN generated by the BIST controller 211, to the comparator 205.

The address generating portion 203 outputs the addresses RADD and CADD to the input MUX 111 while communicating with the BIST information signal generator 201. In detail, the address generating portion 203 includes a stage counter 215 and an address counter 217. The stage counter 215 directs changes in mode for writing data to the memory 101 or reading data from the memory 101. For example, test data is written to all addresses in stage 0, and the content of the addresses is then read at stage 1 by increasing the address number. Complementary test data (i.e, test data bar) is also written to the memory at stage 1. Then, a determination of whether or not the content of the address is the same as the test data written at stage 0 is made. These same steps are repeated for each address. The test data bar is then read from each address at stage 2 by decreasing the address number, and then the read test data bar is checked to determine whether or not the read test data bar is the same as the written test data bar. The test data is then written, and the pattern is read in the address. Lastly, the pattern is read from each address at stage 3 and then it is determined whether or not the read pattern is the same as the pattern written at stage 2. During the above steps, it can be detected whether of not the memory 101 has failed.

Referring still to FIG. 2, the address counter 217 designates an address by sequentially increasing or decreasing the address number of the memory 101. The comparator 205 compares the signal output from the data generator 213 with a signal DROUT output from the memory 101 to generate a fail indication signal ERR indicating whether or not the memory 101 is in failure. That is, if failure occurs in the memory, the fail indication signal ERR goes to "1", and otherwise the fail indication signal ERR is "0".

The fail address indicating portion 207 stores the address of the memory 101 at which the input data and the output data are determined to be different. In detail, the fail address indicating portion 207 includes a clock counter 219 and a clock number register 221. The clock counter 219 counts the number of clock cycles until an error is detected in the memory 101. Also, the clock number register 221 stores the number of clock cycles counted by the clock counter 219. The values stored in the clock number register 221 are output in series after the test, as a redundancy information extracting signal RED. The refresh counter 209 counts the number of refreshes of the memory 101 in a refresh mode while communicating with the BIST information signal generator 201.

Figure 3:
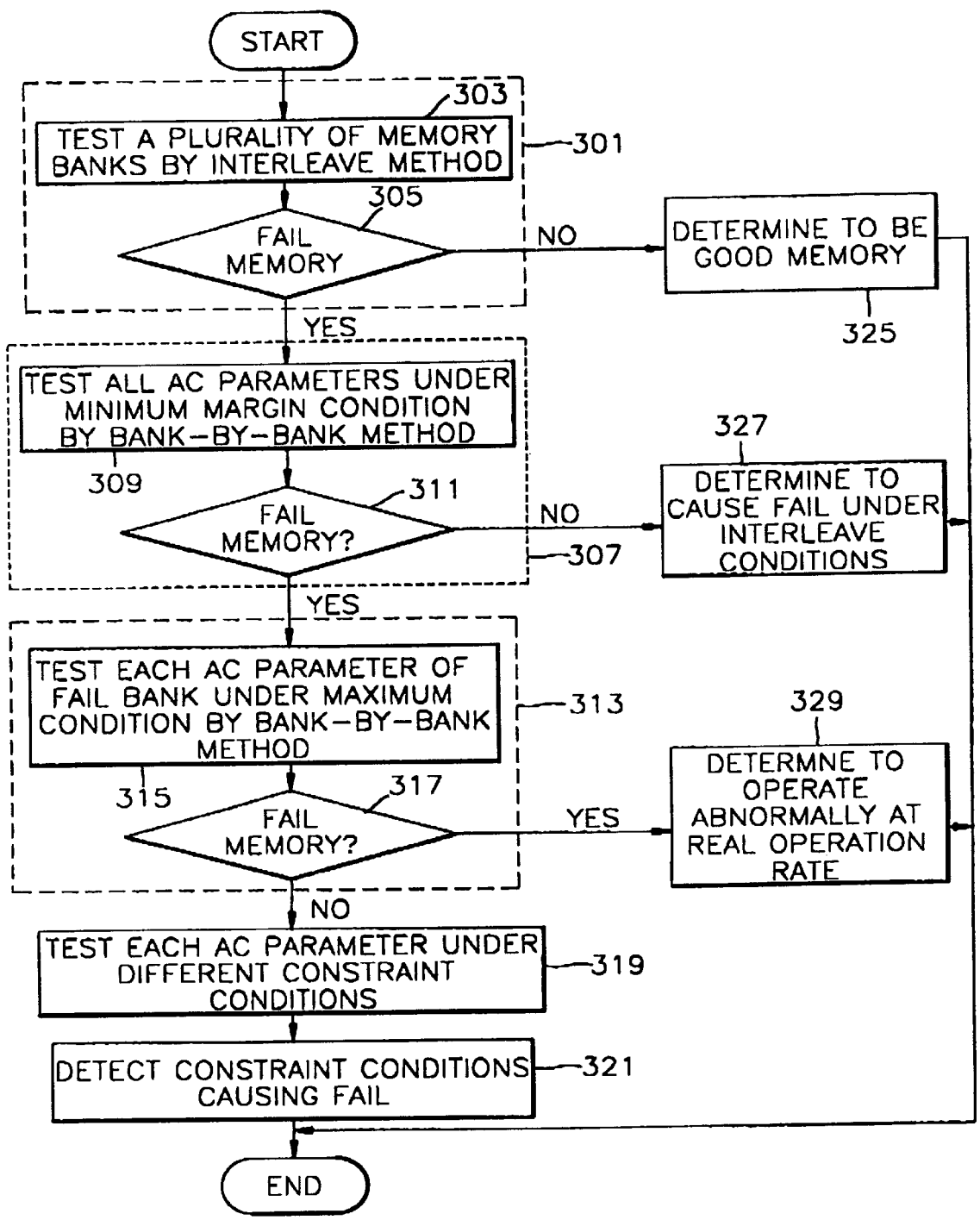
FIG. 3 is a flow diagram of operations which illustrates a preferred method of testing an integrated circuit memory device.

FIG. 3 is a flowchart illustrating a BIST method using the BIST circuit according to the present invention. First, in step 301, a plurality of banks are tested using an interleaving test method (step 303) in order to determine whether or not the memory has failures (step 305). If it is determined in step 301 that the memory has a failed bank, then in step 307 AC parameters of each bank are tested using a bank-by-bank method under minimum margin conditions (step 309) to test whether or not the memory has failures (step 311). Also, if it is determined in the step 307 that the memory has a failed bank, then in step 313 all AC parameters are tested using the bank-by-bank method under maximum margin conditions (step 315), to test whether or not the memory has failure (step 317). If the memory has no failure, each AC parameter is tested under different constrained conditions (step 319), and the corresponding constrained condition where a failure is detected is recognized to reveal the particular constrained condition under which the failure occurs (step 321).

If it is determined in step 301 that the memory has no failed bank, the memory is determined to be good (step 325). Also, if it is determined in step 307 that the memory has no failed bank, the memory is determined to cause failure in the interleave condition (step 327). Finally, if the memory is determined to have failure in step 313, it is determined that the memory does not operate normally at a real operation rate (step 329).

Figure 4:
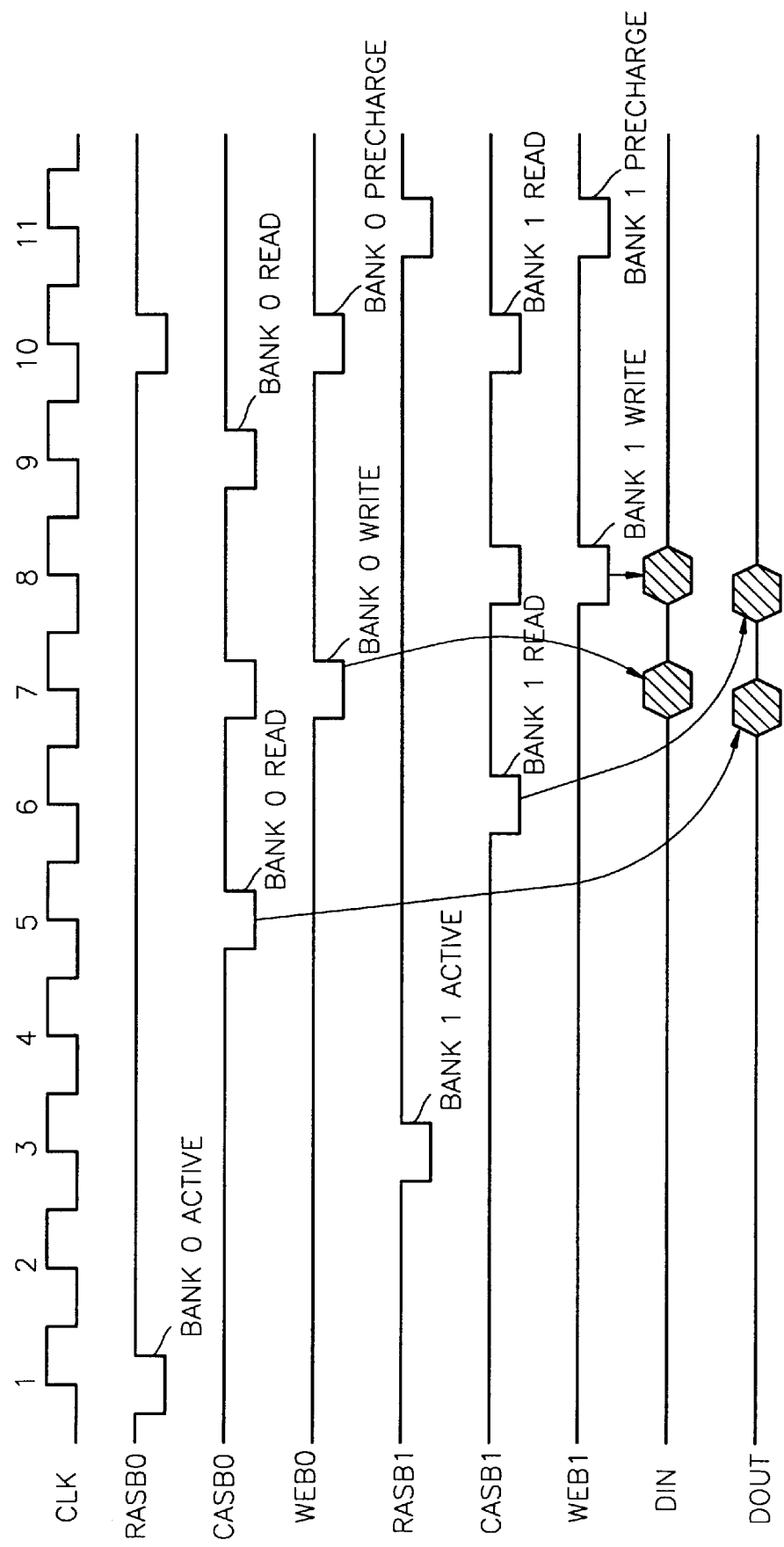
FIG. 4 is a timing diagram which illustrates a method of performing an interleave test on a plurality of memory banks, according to another embodiment of the present invention.

FIG. 4 is a timing diagram illustrating the interleave method used in the test of FIG. 3. Referring to FIG. 4, the signals RASB0, CASB0 and WEB0, which are synchronized with a clock signal CLK, test bank 0 which is one of banks of the memory 101. Also, the signals RASB1, CASB1 and WEB1, which are synchronized with the clock signal CLK, test bank 1 which is another bank of the memory 101. In the interleave method, the banks 0 and 1 are alternately tested as shown in FIG. 4.

Figure 5:
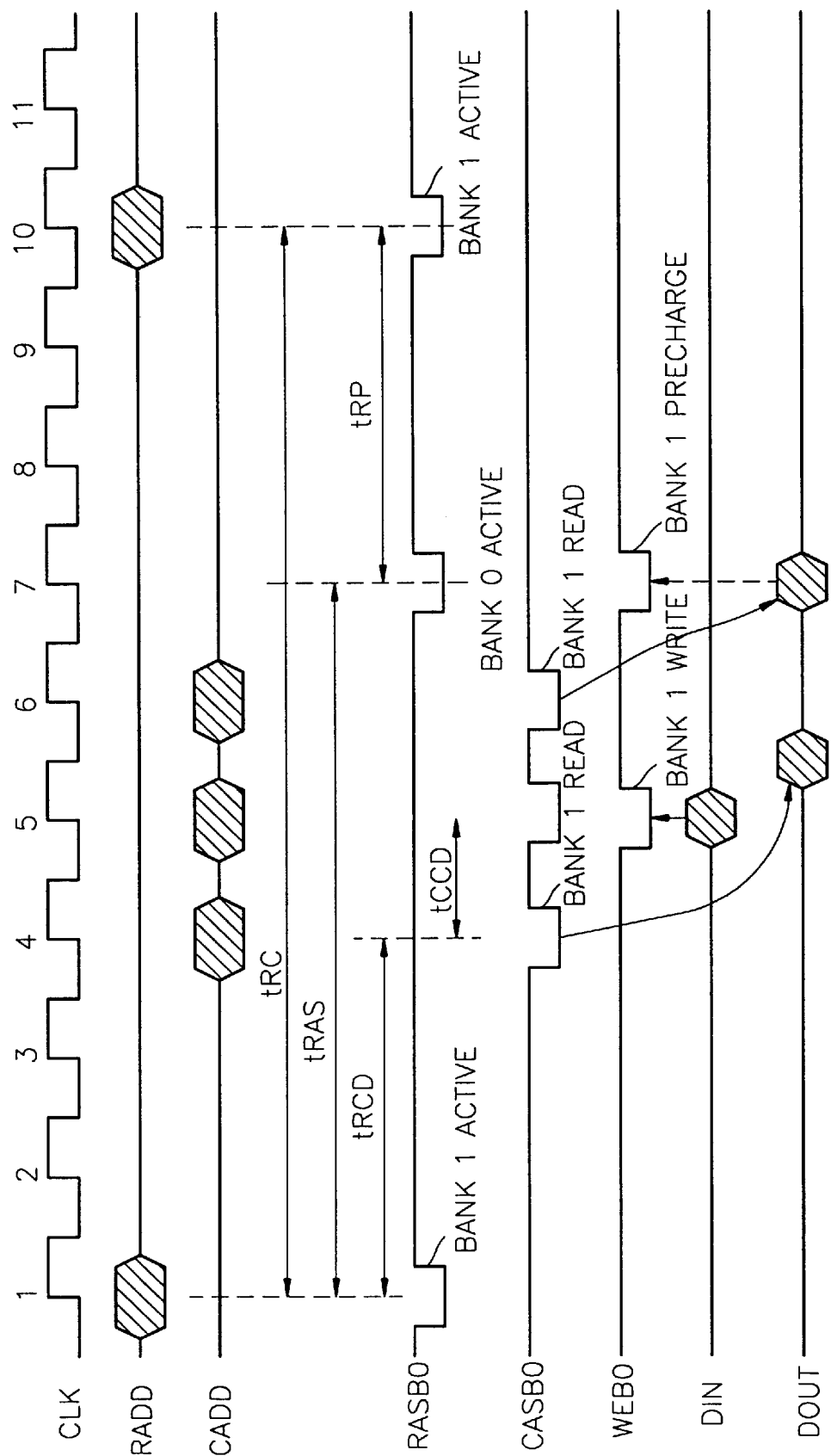
FIG. 5 is a timing diagram which illustrates a method of performing a bank-by-bank test on a plurality of memory banks, according to still another embodiment of the present invention.

FIG. 5 is a timing diagram illustrating the bank-by-bank test method used in the test of FIG. 3. First, time intervals tRC, rRAS, tRCD, tRP and tCCD are set to minimum margin values. Here, tRC represents a time interval from a bank active time to the next bank active time, tRAS represents a time interval from the bank active time to a bank precharge time, tRCD represents a time interval from the bank active time till a bank read command is generated, rRP represents a time interval from the bank precharge time to the bank active time and TCCD represents a column address to column address delay time.

The AC parameters are tested under the above minimum conditions to test whether or not the memory has a failure. Here, if there is no failure, it is determined that the failure of the memory occurs in the interleave condition. Also, if an error is detected, the AC parameters for each bank are tested by setting tRC, tRAS, tRCD, tRP and tCCD to their maximum margin values. If a failure is detected under this condition, it is determined that the memory installed in the MML can not operate normally at a real operation rate.

If it is determined that the memory has no failure after the test of each AC parameter under the maximum margin conditions, more testing is performed by changing the conditions again. That is, tRP is set to the minimum margin and the margins of the other parameters are set by adding a margin of one or more clock cycles to the minimum margin. Here, if there is no failure, it is determined that tRP characteristics satisfy the conditions of a user. Each AC parameter is tested in a similar fashion.

The test on each parameter is performed by sequentially increasing or decreasing the address number, and the address having an error is stored in the clock number register 221 of FIG. 2. Also, after the test is completed, the value stored in the clock number register 221 is output as redundancy information.

While the present invention has been illustrated and described with reference to a specific embodiment, further modifications and alterations within the spirit and scope of this invention will occur to those skilled in the art. For example, while the built-in self test circuit and the test method using the circuit are applied to test the memory having two banks in the embodiment, it is expected that the built-in self test circuit and test method can be applied to a memory having a plurality of banks.

That which is claimed is:

1. A method of testing a multi-bank integrated circuit memory device, comprising the steps of:

performing an interleave test on a plurality of memory banks in the memory device, to determine a first test failure;

performing a bank-by-bank test on the plurality of memory banks with all of a plurality of AC parameters set to respective minimum margin conditions, to determine a second test failure;

performing a bank-by-bank test on the plurality of memory banks with all of the plurality of AC parameters set to respective maximum margin conditions, to determine a third test failure; and performing a bank-by-bank test on the plurality of memory banks with only one of the plurality of AC parameters set to a respective minimum margin condition, if the first and second test failures occur but the third test failure does not occur.

2. The method of claim 1, wherein the plurality of memory banks include a first bank; and wherein the plurality of AC parameters include a first bank active to first bank active time interval (tRC), a first bank active to first bank read time interval (tRCD), a first bank active to first bank precharge time interval (tRAS), a first bank precharge to first bank active time interval (tRP) and a column address to column address delay time interval (tCCD).

3. A method of testing a multi-bank integrated circuit memory device, comprising the steps of:

performing a bank-by-bank test on a plurality of memory banks with all of a plurality of AC parameters set to respective maximum margin conditions, to determine a test failure; and then performing a bank-by-bank test on the plurality of memory banks with only one of the plurality of AC parameters set to a respective minimum margin condition, if and only if the test failure does not occur.

4. The method of claim 3, wherein the plurality of memory banks include a first bank; and wherein the plurality of AC parameters include a first bank active to first bank active time interval (tRC), a first bank active to first bank read time interval (tRCD), a first bank active to first bank precharge time interval (tRAS), a first bank precharge to first bank active time interval (tRP) and a column address to column address delay time interval (tCCD).

5. A built-in self test circuit of a merged memory with logic in which a semiconductor memory having a plurality of banks and a logic circuit are implemented, the built-in test circuit comprising:

a built-in self test (BIST) portion for generating a predetermined BIST information signal in response to an external clock signal and a BIST mode indication signal; and a switch multiplexer for outputting a signal to the memory by receiving a logic clock signal and a logic information signal output from the logic circuit, in a normal mode, and outputting a signal to the memory by receiving the external clock signal and the BIST information signal, wherein the BIST portion detects the fail address by comparing data written to the memory with data output from the memory.

6. The built-in self test circuit of claim 5, wherein the BIST portion comprises:

a BIST information signal generator for outputting input data and a control signal to the memory via the switch multiplexer in response to the external clock signal and the BIST mode indication signal, in the BIST mode, and for storing the input data;

an address generator for outputting an address of memory to be tested to the switch multiplexer while communicating with the BIST information signal generator; and a comparator for comparing the input data generated by the BIST information signal generator, with output data read from the memory, to generate a fail indication signal indicating whether or not the memory has failure.

7. The built-in self test circuit of claim 6, wherein the BIST information signal generator comprises:

a BIST controller for outputting the input data and the control signal to the memory via the switch multiplexer in response to the external clock signal and the BIST mode indication signal, in the BIST mode; and a data generator for generating the input data to the comparator.

8. The built-in self test circuit of claim 6, wherein the address generator comprises:

a stage counter for directing changes of mode, to write data to the memory or read data from the memory; and an address counter for designating an address by sequentially increasing or decreasing the address number of the memory.

9. The built-in self test circuit of claim 6, wherein the BIST portion further comprises a fail address indicating portion for storing the address of the memory when the input data and output data of the memory are different.

10. The built-in self test circuit of claim 9, wherein the fail address indicating portion comprises:

a clock counter for counting the number of clock cycles until detecting the fail bit in the memory; and a clock number register for storing the number of clock cycles counted by the clock counter.

11. The built-in self test circuit of claim 6, wherein the BIST portion further comprises a refresh counter for counting the number of refreshes of the memory while communicating with the BIST information signal generator.

12. A built-in self test method for a merged memory with logic in which a memory having a plurality of banks and a logic circuit are implemented, the method comprising the steps of:

(a) testing the plurality of banks of the memory by an interleave condition;

(b) testing all AC parameters under the minimum margin conditions by a bank-by-bank test method, if the memory is determined to have failure in the step (a);

(c) testing all AC parameters under the maximum margin conditions by the bank-by-bank test method, if the memory is determined to have failure in the step (b);

(d) testing all AC parameters for each bank under different constrained conditions, if the memory is determined to have no failure in the step (c);

(e) detecting the particular constrained conditions which cause failure in the step (d); and (f) determining the memory to be good if the fail bank is not detected in the step (a), the memory to have failure under the interleave condition if the fail bank is not detected in the step (b), and the memory to be defective to the extent that is cannot normally operate at a read operation rate, if the failure is detected in the step (c).

* * * * *